United States Patent [19]

Mahulikar

[11] Patent Number: 5,741,544
[45] Date of Patent: Apr. 21, 1998

[54] ARTICLES USING SPECIALIZED VAPOR DEPOSITION PROCESSES

[75] Inventor: Deepak Mahulikar, Madison, Conn.

[73] Assignee: Olin Corporation, New Haven, Conn.

[21] Appl. No.: 521,858

[22] Filed: Aug. 31, 1995

[51] Int. Cl.[6] .................................................. B05D 7/22
[52] U.S. Cl. ........................ 427/236; 427/237; 427/239; 427/250; 427/294; 427/295
[58] Field of Search ................................ 427/236, 237, 427/239, 294, 295, 250

[56] References Cited

U.S. PATENT DOCUMENTS

| | | |
|---|---|---|
| 3,866,565 | 2/1975 | Ridout . |
| 4,116,160 | 9/1978 | Langley et al. ............... 118/48 |
| 4,190,019 | 2/1980 | Hunt ............................... 118/720 |
| 4,294,871 | 10/1981 | Hieber et al. ................. 427/237 |
| 4,354,456 | 10/1982 | Campbell et al. ............ 118/721 |
| 4,606,941 | 8/1986 | Jenkin ............................ 427/217 |
| 4,606,942 | 8/1986 | Shriver et al. ................ 427/233 |
| 4,682,565 | 7/1987 | Carrico .......................... 118/719 |
| 4,715,316 | 12/1987 | Broomfield et al. ......... 118/716 |
| 4,808,291 | 2/1989 | Denton et al. ................ 204/298 |
| 4,814,056 | 3/1989 | Welty ............................. 204/298 |
| 4,920,911 | 5/1990 | Gould et al. .................. 118/301 |
| 4,926,792 | 5/1990 | Bell et al. ...................... 118/729 |
| 5,005,518 | 4/1991 | Yamada ......................... 118/716 |
| 5,149,376 | 9/1992 | Fournes et al. ............... 118/719 |
| 5,320,689 | 6/1994 | Mahulikar et al. ........... 148/436 |
| 5,356,673 | 10/1994 | Schmitt et al. ................ 427/446 |
| 5,382,293 | 1/1995 | Kawarada et al. ........... 118/723 |

*Primary Examiner*—Janyce Bell
*Attorney, Agent, or Firm*—Robert Scott Hauser; Gregory S. Rosenblatt; Wiggin & Dana

[57] ABSTRACT

Various types of articles having various deposition coatings applied using a gas vapor deposition process are provided. A system evacuates gases from the article or a deposition chamber prior to depositing a coating. The coating may be applied throughout the inside of an article or may be selectively applied to a portion of the article. The article may be moved relative to the gas jet or the gas may be moved jet relative to the article. Stencils may be used to pattern the coating on the surface of the article. The articles are coated in a pressure of approximately 5 millitorr. Articles may be cylindrically shaped, leadframes on a reel, substrates, or printed circuit boards.

18 Claims, 3 Drawing Sheets

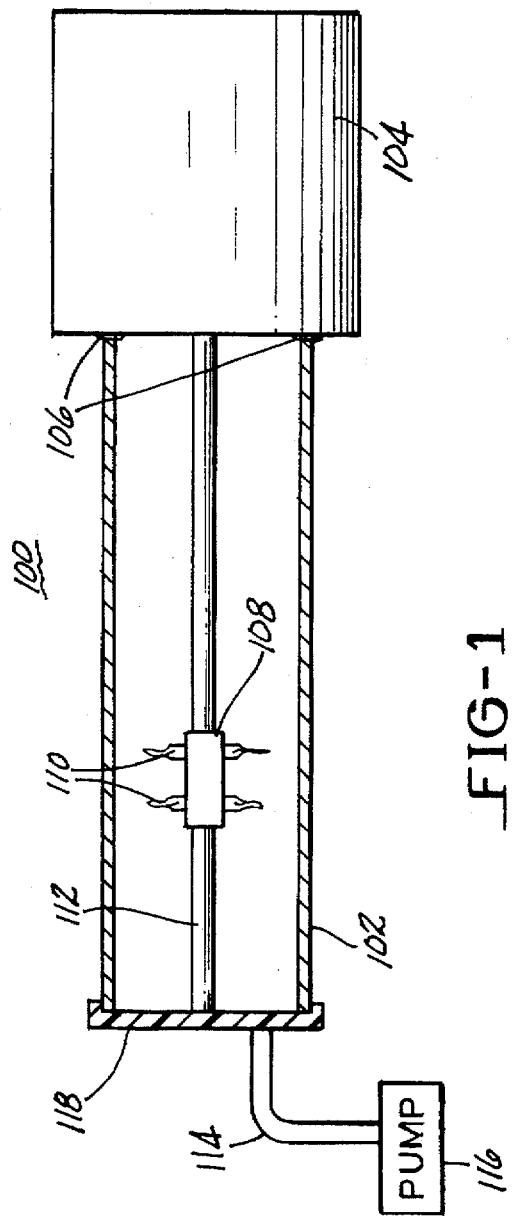
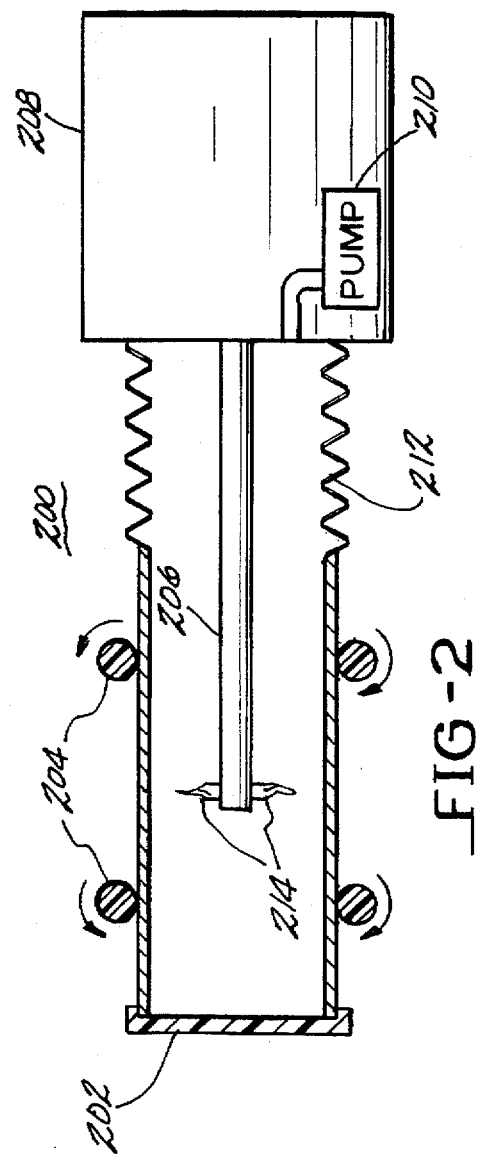

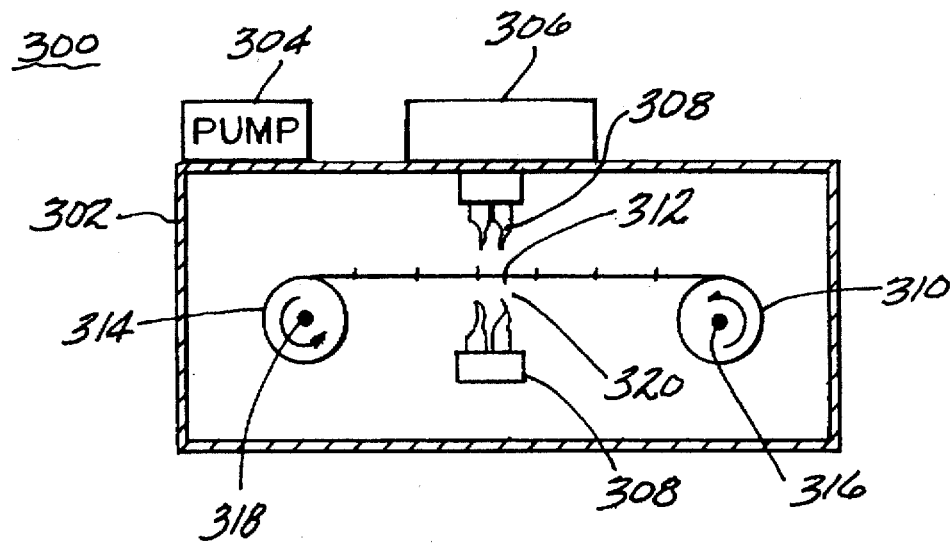
FIG-3
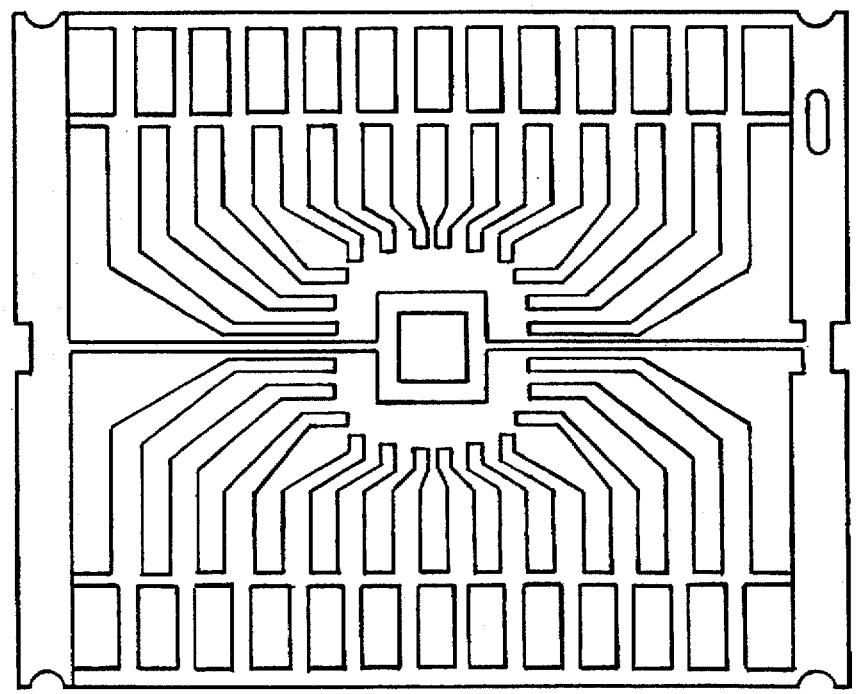
PRIOR ART  FIG-4

ARTICLES USING SPECIALIZED VAPOR DEPOSITION PROCESSES

BACKGROUND OF THE INVENTION

1. Field of the Invention

This invention relates to depositing coatings on various types of articles, substrates, and interconnects. More particularly, this invention related to depositing metals and ceramics on articles, substrates, and interconnects using gas jet vapor deposition.

2. Discussion of the Related Art

Various disciplines use coated articles. These coatings, also known as films, may be of various thicknesses and deposited on various surfaces. The electrical and electronic arts, for example, use coatings deposited on substrates as wiring layers, interconnection layers, or insulation layers to name a few. The mechanical arts use coatings on components to prevent corrosion or leaching of materials making up the components, for example.

Those skilled in the art of coating application use various types of techniques for depositing films. Chemical vapor deposition (CVD) is one such technique which produces a non-volatile solid film on an article by the surface pyrolized reaction of gaseous reagents that can contain the desired film constituents. However, the CVD process typically heats the article in a range from 500° C. to 1600° C. Thus, CVD requires that articles remain stable in temperatures up to 1600° C. limiting the number of articles which can be coated.

Another type of CVD, plasma enhanced CVD (PECVD), operates in temperatures as low as 300° C. by heating an article using a radio frequency electronic field. The radio frequency electronic filed, however, may cause structural damage to the article and film during growth.

Because both CVD processes rely primarily on loosely directed flow of gasses, varying concentrations of gases near the article surface adversely affect both processes. An additional disadvantage is that CVD typically uses highly toxic gases.

Physical vapor deposition (PVD) is another deposition process and includes methods of evaporation, sputtering, molecular beam epitaxy, and vapor phase epitaxy. PVD operates by changing a solid material to a vapor in a deposition chamber and allowing the vapor to condense on an article. However, PVD requires a low pressure of approximately $10^{-6}$ Torr which is expensive to create and maintain. Furthermore, when the pressure is too high, collisions with vapor molecules interfere with vapor transport and reduce deposition rates. Slower deposition rates translate into longer processing time and more expensive production. Moreover, PVD has a low conversion efficiency because condensation of the deposition material occurs throughout the entire deposition chamber and cannot directed to specific areas. Thus, much of the deposition material is lost to waste, translating into higher production costs.

Typically, PVD processes are expensive and slow. For example, an epitaxial beam system can cost on the order of $1 Million to $3 Million (U.S.) dollars and requires 1 to 2 hours to deposit a film of 1 micron.

Liquid phase processes, such as electroplating, also deposit films, however, the quality of these films is usually inferior to those prepared by the above coating methods because of contamination by impurities in the liquid source and porosity of the plated material. Furthermore, when masks are used to selectively apply the plating material, typically some of plating material reaches areas past the boundary of the mask. Also, liquid phase processes usually require chemicals which are hazardous to the environment. Liquid processes are also limited to coatings that are electroplatable such as nickel, copper, gold, and silver. For example, liquid processes cannot easily plate aluminum or its alloys.

A common example of the problems associated with the above methods occurs in the production of leadframes. Leadframes are typically produced in a continuous strip of metal, usually a copper alloy or an iron-nickel alloy, by stamping or etching. Typically, a copper flash coating is then applied to provide a bonding surface for the subsequent application of a metal, such as silver. Silver requires a copper flash coating because it does not bond well to all copper alloys. To apply the metal, a mask is attached or formed on the flash copper coated leadframe strip and the assembly is dipped in liquid silver and electroplated in the area where a substrate will be subsequently bonded. Masks are typically rubber or photomasks. The plated silver prevents oxidation of the leadtips during substrate bonding and subsequent layer bonding. However, silver is normally porous and unless the layer is of sufficient thickness, typically 6 microns, oxidation will still occur. Furthermore, during the electroplating process some of the silver is deposited on portions away from the bonding site. This extra metal causes adhesion problems with molding compounds during subsequent packaging steps. After the silver is coated, a substrate or a semiconductor component, for example, is bonded, leads are wire bonded to the chip, the assembly is enclosed in a plastic molding, and then leads are solder plated and formed.

Each of the above steps in preparing the leadframe for bonding requires a different and relatively expensive process. Moreover, each typically uses chemicals which raise environmental and safety concerns.

Another area which benefits from coatings is enclosed gas and liquid transportation. Coatings prevent contamination of the transported gas or liquid from the materials comprising the enclosure through leaching or corrosion. Furthermore, corrosion shortens the life of the enclosures.

The common method of coating these enclosures, typically tubes, by electroplating is difficult and inefficient because the enclosures are generally very long and require plating tanks of the same length. Moreover, inspection of the electroplated surface is difficult.

In light of the problems associated with the above techniques, Schmitt et al. developed a process allowing film deposition at higher pressures without diffusion governed by transport limitations. Their process is found in U.S. Pat. No. 5,356,673 issued to Schmitt et al. on Oct. 18, 1994 and is herein incorporated by reference in its entirety.

The U.S. Pat. No. 5,356,673 patent discloses a method and apparatus for depositing thin films of materials such as oxides and nitrides at low temperatures and a pressure of approximately $5 \times 10^{-3}$ Torr. The method and apparatus rely on a supersonic free jet and inert carrier gas to transport vapor species generated from an evaporation source to the surface of a substrate. The method and apparatus generate vapor species from solid film precursor materials, including those in the form of wires or powders. The system carries this vapor downstream in a low pressure, supersonic jet of inert gas to the surface of the substrate where the vapor deposits to form a thin film. The system may move the substrate past a gas jet containing a reactant gas in which the discharge has been generated at a speed sufficient to form a thin film which is chemically composed of the evaporated material and the reactant gases.

However, Schmitt et al. do not disclose systems for applying their gas jet deposition process to a wide range of articles. Accordingly, a system and method are needed to allow gas jet deposition to deposit films on articles of various types and sizes.

SUMMARY OF THE INVENTION

Accordingly, this invention is directed to products and processes using gas jet vapor deposition that substantially obviates one or more of the problems do to limitations and disadvantages of the related art.

As embodied and broadly described, the invention for producing a coated heat exchanger tube comprises the steps of placing at least one gas jet inside the heat exchanger tube, creating an air-tight seal on both ends of the heat exchanger tube, evacuating the inside of the heat exchanger tube to a pressure no less than 5 millitorr, and depositing a coating on the inside of the heat exchanger tube by gas jet vapor deposition.

In another aspect of the invention a method for producing coating on an article having an inside, an outside, and openings between the inside and outside comprises the steps of placing at least one gas jet inside the article, creating an air-tight seal on each of the openings of the article, evacuating the inside of the article to a pressure no less than 5 millitorr, and depositing a coating on the inside of the article by gas jet vapor deposition.

In still another aspect of the invention a method for preparing leadframes for substrate bonding comprises the steps of positioning at least one leadframe in a deposition chamber, evacuating the deposition chamber to a pressure no less than 5 millitorr, providing at least one gas jet for depositing at least one coating on a portion of each of the at least one leadframe by gas jet vapor deposition.

It is to be understood that both the foregoing general descriptions and the following detailed descriptions are exemplary and explanatory and are intended to provide further explanation of the invention as claimed.

The accompanying drawings are included to provide a further understanding of the invention and are incorporated in and constitute a part of the specification illustrating several embodiments of the invention and together with the description serve to explain the principles of the invention.

BRIEF DESCRIPTION OF THE DRAWINGS

FIG. 1 is a simplified side illustration of a system for depositing coatings on an article having an inside and an outside according to a preferred embodiment the present invention;

FIG. 2 is a simplified side illustration of a system for depositing coatings on an article having an inside and an outside according to another preferred embodiment of the present invention;

FIG. 3 is a side illustration showing a system for depositing coatings on portions of articles according to still another preferred embodiment of the invention;

FIG. 4 is an illustration of a leadframe;

DETAILED DESCRIPTION OF THE PREFERRED EMBODIMENTS

Figure 5:
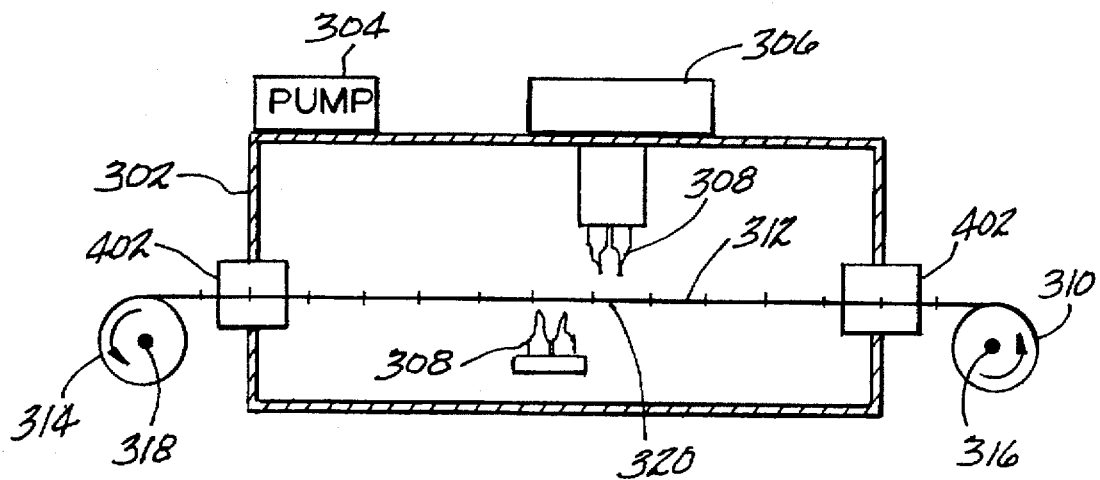
FIG. 5 is another illustration showing a system for depositing coatings on selected portions of articles according to still another preferred embodiment of the present invention.

Reference will now be made in detail to the present preferred embodiments of the invention, examples of which are illustrated in the accompanying drawings.

An exemplary embodiment of a system for producing deposited coatings on a plurality of articles of the present invention includes an article, a stopper, a pump, a vacuum hose, gas jets, a translation unit, a gas jet unit, a seal, and a guide.

As embodied herein and referring to FIG. 1, a system for producing deposited coatings on a plurality of articles denoted generally by numeral 100 includes article 102, gas jet unit 104, seal 106, translation unit 108, gas jets 110, guide 112, vacuum hose 114, pump 116, and stopper 118.

Stopper 118 attaches to one end of article 102. Vacuum hose 114 attaches to stopper 118 on one of its ends and to pump 116 on the other. Gas jet unit 104 attaches to the end of article 102 opposite stopper 118 via seal 106. Guide 112 attaches to gas jet unit 104 and extends lengthwise through article 102 to stopper 118. Gas jets 110 attach to translation unit 108. Translation unit 108 movably attaches to guide 112.

During preferred operation, stopper 118 and gas jet unit 104 via seal 106 seal the inside of article 102. Pump 116 then evacuates the inside of article 102 through vacuum hose 114. Once pump 116 creates a desired vacuum inside article 102, gas jet unit 104 operates gas jets 110 and translation unit 108. Gas jet unit 104 operates translation unit 108 to move gas jets 110 along the length of guide 112. Gas jet unit 104 operates gas jets 110 to deposit coatings on the inside of article 102 as gas jets 110 move along guide 112.

Pump 116 evacuates the gasses inside article 102 to create a pressure of no less than $5 \times 10^{-3}$ Torr. Pump 116 may be of any type of pump that removes gasses to create a vacuum. Vacuum hose 114 which attaches to pump 116 and to stopper 118 may be of any type of connector that allows gasses to pass from the inside of article 102 to pump 116. Accordingly, vacuum hose 114 may be flexible or rigid and of varying sizes and lengths. One skilled in the art would recognize many other ways and configurations to evacuate gasses from the inside of article 102. One skilled in the art would also recognize that pump 116 could alternatively remove gasses through a port located on gas jet unit 104 within an area bounded by seal 106. Furthermore, pump 116 could be attached without using a vacuum hose.

Stopper 118 fits snugly over one open end of article 102 to prevent gasses from entering the inside of article 102. Stopper 118 conforms to the shape of the open end of article 102 and includes a port (not shown) where vacuum hose 114 attaches. Stopper 118 may attach to article 102 in any of a number of different ways, each being a design choice. Stopper 118 may be of any type of material which functions to cover one open end of article 102 and prevent gasses from entering the inside of article 102 when pump 116 evacuates the inside of article 102.

Seal 106 allows article 102 to be seated against gas jet unit 104. Seal 106 substantially conforms to a shape made by an open end of article 102 and may be of any type of material which allows article 102 to be firmly placed against gas jet unit 104 and prevent gasses from entering the inside of article 102 when a pressure inside article 102 is less than a pressure on the outside of article 102. One skilled in the art would recognize that seal 106 may be made of many type of material which provides an air tight seal from one object to another.

Gas jet unit 104 contains those elements necessary to operate both gas jets 110 and control the movement of translation unit 108 along guide 112.

Translation unit 108 supports gas jets 110 and moves them along the length of guide 112. Translation unit 108, under the control of gas jet unit 104, moves gas jets 110 from one end of guide 112 to the other end so that gas jets 110 deposit a coating throughout the inside of article 102. Translation unit 108 may move gas jets 110 in any manner, speed, or direction that results in deposition coverage of the inside of article 102. For example, in one configuration translation unit 108 may move gas jets 110 from a position close to gas jet unit 104 to a position close to stopper 118, and in another configuration translation unit 108 may move gas jets 110 from a position close to stopper 118 to a position close to gas jet unit 104. Translation unit 108 may be of any configuration which allows gas jets 110 to move throughout the inside of article 102. One skilled in the art would recognize many different ways to achieve this result.

Guide 112 provides support for translation unit 108. Guide 112 may be made of any type of material with sufficient strength to support translation unit 108.

In operation, an operator attaches article 102 to gas jet unit 104 and attaches stopper 118 to the other end of article 102. Of course, one skilled in the art would recognize that the order of attachment is not important and that attachment may be accomplished in any number of different ways including by hand or any type of automated process. Vacuum hose 114, if not already attached to stopper 118, attaches to stopper 118.

The operator then activates pump 116 which evacuates gasses from the inside of article 102 to a pressure of no less than $5 \times 10^{-3}$ Torr. The operator activates gas jet unit 104 to begin deposition. As discussed above, gas jet unit 104 operates translation unit 108 to move it along guide 117 while gas jets 110 deposit a coating throughout the inside of article 102.

Another preferred embodiment according to the invention includes a gas jet evacuation unit, a pump, a flexible attachment, a support, a translation means, a stopper, an article, and gas jets.

As herein embodied and referring generally to FIG. 2, a system for depositing coatings on a plurality of articles denoted generally by numeral 200 includes stopper 202, translation means 204, support 206, gas jet/evacuation unit 208, pump 210, flexible attachment 212, gas jets 214, and article 216.

Stopper 202 attaches to one end of article 216. Flexible attachment 212 attaches to the other end of article 216 and also to gas jet/evacuation unit 208. Translation means 204 abuts article 216 in several places. Support 206 attaches to gas jet/evacuation unit 208 on one end and to gas jets 214 on the other end. Pump 210 is included in gas jet/evacuation unit 208 and connects in such a way as to allow evacuation of gasses from the inside of article 216.

The embodiment of FIG. 2 is similar to system 100 shown in FIG. 1 in that a coating is deposited on the inside of an article except that instead of gas jets 110 moving relative to article 102 as in system 100, system 200 as shown in FIG. 2 moves article 216 relative to gas jets 214.

Stopper 202 fits snugly on one end of article 216 to create an air tight seal preventing gasses from entering the inside of article 216 when the inside of article 216 is evacuated.

Pump 210 is located in gas jet/evacuation unit 208 and evacuates gasses from the inside of article 216. Preferably pump 210 evacuates the inside of article 216 to a pressure no less than $5 \times 10^{-3}$ Torr. Pump 210 may be of any type pump which can create a vacuum in the inside of article 216. Alternatively, pump 216 may also be attached to stopper 202.

Translation means 204 moves article 216 along a path defined by support 206. As illustrated in FIG. 2, translation means 204 includes at least four rollers located around the outside of article 216. Translation means 204 moves article 216 by rotating each of the rollers in the same direction. Translation means 204 need only be sufficient to move article 216 along the path defined by support 206. One skilled in the art would recognize that the particular implementation of translation means 204 would be a matter of design choice.

Support 206 attaches to gas jet/evacuation unit 208 and extends in a direction away from gas jet/evacuation unit 208. Support 206 may be any type of material that supports gas jets 214 in a fixed position at an end of support 206 opposite the end attached to gas jet/evacuation unit 208.

Flexible attachment 212 provides an airtight seal between article 216 and gas jet/evacuation unit 208. Flexible attachment 214 also allows translation means 204 to move article 216 freely along a path defined by support 206 without breaking the airtight seal. In one movement, translation means 204 moves article 216 toward gas jet/evacuation unit 208 so that the end of article 216 having the stopper thereon is in a position so that gas jets 214 may coat the inside of article 216 on the end where stopper 202 attaches. In another movement, translation means 204 moves article 216 in a direction away from gas jet/evacuation unit 208 so that gas jets 214 coat the end of article 216 attached to flexible attachment 212. Thus, translation means 204 moves article 216 so that gas jets 214 coat the entire inside of article 216.

In operation, system 200 is similar to system 100 except article 216 is translated by translation means 204 relative to gas jets 214 rather than translation unit 108 moving gas jets 110 relative to article 102.

An operator places article 216 in translation means 204 and attaches to article 216 both stopper 202 and flexible attachment 212. The order of attachment is not important. The operator then activates gas jet/evacuation unit 208 which operates pump 210 to evacuate the inside of article 216, activates translation unit 204 to move article 216, and operates gas jets 214 to deposit a coating throughout the inside of article 216.

In both above embodiments, the article is preferably cylindrically shaped. More particularly, the cylindrically shaped article is a heat exchanger tube. Naturally, one skilled in the art would recognize that many types of articles could be coated in a like manner. Preferably, the heat exchanger is a copper alloy, however it may be other materials including, copper, lead, steel, titanium, an alloy thereof, or plastic. The above process could also be applied to an enhanced heat exchanger tube having raised surfaces on its inside to create turbulent flow.

Typically, the coating, sometimes called layer, must be relatively thick because conventional methods produce a rather porous coating. Thus, the coating must normally be over 10 microns thick to achieve the desired protection against corrosion and leaching. JVD, however, does not create a coating that is as porous as the conventional method, and thus, the coating can be made much thinner. Preferably, the coating need only be 1 to 5 microns thick.

A heat exchanger tube made using the above system and process can be produced efficiently without the use of environmentally unfriendly materials. For example, a liquid plating tank is not necessary.

JVD can coat the tube with an oxide by using oxygen as the carrier gas and the required metal, such as silver, nickel, aluminum, nickel, or palladium, for example, as the transport source. JVD uses nitrogen as the carrier gas and the above metals to deposit nitride coatings in a like manner. Of course, one skilled in the art would recognize various combinations of carrier gasses and metals could be used to produce a desired coating.

According to another embodiment of the invention, a system for depositing coatings includes a deposition chamber, a pump, a gas jet unit, gas jets, a leadframe source spool, a leadframe take-up spool, spindles, and leadframes.

As herein embodied and referring to FIG. 3, a system for depositing coatings includes deposition chamber 302, pump 304, gas jet unit 306, gas jets 308, leadframe source spool 310, leadframes 312, leadframe take-up spool 314, and spindles 316 and 318.

Pump 304 and gas jet unit 306 attach to deposition chamber 302. Gas jets 308 are attached to the inside of deposition chamber 302 and connect to gas jet unit 306. Leadframe source spool 310 attaches to spindle 316 and leadframe take-up spool 314 attached to spindle 318. Spindles 316 and 318 position leadframes 312 below gas jets 308. A leadframe is illustrated in FIG. 4 and area 340 indicates a typical location for deposition of a coating on the leadframe.

Deposition chamber 302 provides an enclosure for deposition which may be evacuated by pump 304 to a pressure less than a pressure outside deposition chamber 302. Presently, the preferred evacuation pressure inside deposition chamber is $5 \times 10^{-3}$ Torr. Deposition chamber 302 may consist any material and be of any type configuration that provides an air-tight enclosure for gas jets 308 and leadframes 312 during deposition.

Pump 304 evacuates gasses from deposition chamber 302. Pump 304 is similar in operation to pumps 116 and 210 described earlier.

Gas jet evacuation unit 306 attaches to deposition chamber 302 and gas jets 308. Gas jet unit 308 operates gas jets 308 to deposit coatings in leadframe deposition area 320. Coatings may be applied to one or both sides of leadframes 312. The size of leadframe deposition area 320 is a function of operational characteristics determined by gas jet unit 306.

Gas jets 308 are similar to gas jets 110 and 214 described earlier. When activated by gas jet unit 306, gas jets 308 deposit coatings in leadframe deposition area 320. Each of the plurality of gas jets 308 may deposit coatings of the same material or each of the plurality may deposit coatings of different materials. Furthermore, there may a plurality of leadframe deposition areas each under gas jets corresponding to a different material coating.

In operation, an operator attaches leadframe source spool 310 to spindle 316 and attaches one end of a leadframe tape to leadframe take-up spool 314 attached to spindle 318 and activates the system. Pump 304 evacuates deposition chamber 302 to a pressure no less than $5 \times 10^{-3}$ Torr. Spindles 316 and 318 rotate to move the leadframe tape so that leadframes 312 move from leadframe source spool 310 into leadframe deposition area 320 and onto leadframe take-up spool 314. When leadframes 312 are in leadframe deposition area 320, gas jet unit 306 activates gas jets 308 to deposit coatings on leadframes 312. Additionally, gas jet unit 306 may activate gas jets in a plurality of leadframe deposition areas so that leadframes 312 may be coated with successive layers of different materials.

In the conventional method of producing leadframes prior to bonding an article such as a substrate or semiconductor component, for example, the leadframe must be coated with a copper flash coating to ensure adequate plating of silver bonding in processing steps. JVD applies coatings directly to the leadframe, thus eliminating the need for applying a copper flash coating. Leadframes typically are copper or iron-nickel alloys.

As described earlier, one disadvantage of conventional methods when applying a coating or layer to suppress oxidation, such as silver, prior to article bonding is that this layer may unintentionally seep into adjoining portions of the leadframe. This unintentional coating causes adhesions problems during later bonding steps and eventual product use. JVD, however, directs the location of the coating. Thus, JVD produces leadframes free of the problems associated with unintentional coating.

Typically, the oxidation suppression layer must be relatively thick because conventional methods of depositing the layer produce a rather porous layer. Thus, to achieve the desired oxidation suppression, the layer must be thick enough to prevent oxygen from reaching the surface of the leadframe. JVD, however, does not create a layer that is as porous as the conventional method, and thus, the layer can be made much thinner. A thinner layer speeds up production and decreases material costs. The layer may be silver, aluminum, tin, palladium, nickel, chromium, iron, or alloys thereof. Preferably, the layer need only be 1 to 3 microns thick.

Additionally, JVD can deposit multiple coatings in the same chamber because of its conversion efficiency. Thus, a second set of gas jets could be added to the system illustrated in FIG. 3 such that after the oxidation suppression layer has been deposited, a bonding layer, such as an adhesive or adhesion enhancing layer, could be deposited. The other layer or layers could consist of silver, aluminum, tin, palladium, zinc, nickel, chromium, iron, or alloys thereof; or oxides, nitrides, carbides, or combinations thereof.

Thus, JVD eliminates the copper flash coating step and combines the steps of applying the oxidation suppression layer and the bonding layer. These improvements to the conventional method of producing leadframes significantly increase production efficiency and decrease the cost and complexity of production.

According to another preferred embodiment as herein embodied and referring generally to FIG. 5, a system for depositing coatings includes deposition chamber 302, pump 304, gas jet unit 306, gas jets 308, leadframe source spool 310, leadframes 312, leadframe take-up spool 314, spindles 316, 318 and ports 402, 404.

Those elements in FIG. 5 corresponding to similar elements in FIG. 3 are like numbered.

The embodiment illustrated in FIG. 5 differs from that in FIG. 3 in that leadframe source spool 310, leadframe take-up spool 314, and spindles 316 and 318 are located outside deposition chamber 302. In this embodiment, leadframes 312 enter deposition chamber 302 from leadframe source spool 310 through port 402 and exit deposition chamber through port 404.

Ports 402 and 404 are air tight ports permitting pump 304 to maintain an vacuum when leadframes 312 enter and exit deposition chamber 302. Thus, new leadframe source spools do not require entry by an operator into deposition chamber 302 breaking the vacuum created by pump 304.

In another preferred embodiment, a system for depositing coatings on plurality of articles includes a deposition chamber, a pump, a gas jet unit, a plurality of articles, gas jets, and at least one stencil.

Figure 6:
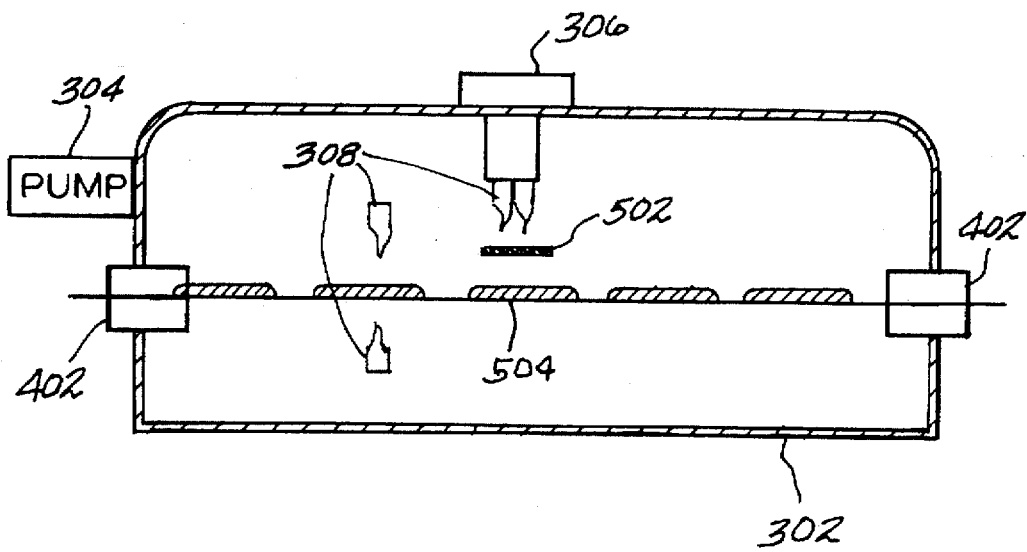
FIG. 6 is an illustration showing depositing of coatings using a stencil according to yet another preferred embodiment of the present invention.

As herein embodied and referring generally to FIG. 6, the system includes deposition chamber 302, gas jet unit 306, gas jets 308, pump 304, ports 402 and 404, stencil 502, and article 504. Elements similar to elements in FIG. 4 are like numbered.

Article 504 moves into deposition chamber through port 402 to a position under stencil 502. A stencil positioning unit (not shown) places stencil 502 on article 504. Gas jet unit 306 activates gas jets 308 to deposit a coating onto article 504 patterned by stencil 502. The stencil positioning unit removes stencil 502 from article 504 and article 504 moves out of deposition chamber 302.

Stencil 502 is designed in such a way to allow coatings to be selectively deposited as defined by the design. Stencil 502 may be metal or a photomask.

Alternatively, a plurality of stencil positioning units may position a plurality of stencils under a plurality of gas jets in succession to apply successive coatings in different patterns and different materials. For example, successive wiring layers separated by insulation layers could be applied to printed circuit boards in the same deposition chamber. The insulation layer may include $Al_2O_3$ JVD coatings.

In operation, the user moves new articles, such as printed circuit boards, into deposition chamber 302. The positioning unit positions stencil 502 over article 502 and gas jet unit 306 causes gas jets 308 to applying a coating to one or both sides of article 504. Additionally, there may be provided additional jets down stream from gas jets 306 which apply a different coating or layer of the same or a different material. One skilled in the art would recognize that it would be obvious to extend the process to include as many sets of gas jets as needed to deposit a required number of layers within deposition chamber 302.

The above process applies equally well to connectors as it does to leadframes.

Using the above described process for producing articles coated using JVD, multiple steps in conventional processes can be combined and production costs significantly decreased.

It will be apparent to those skilled in the art that various modifications and variations can be made in the elements of the present invention without departing from the spirit or scope of the invention. Thus, it is intended that the present invention cover the modifications and variations of this invention provided that they come within the scope of the appended claims and their equivalents. For example, the JVD process and method described above may be used to produce any product in which multiple plating is involved using silver, nickel, aluminum, and any of their alloys. Such processes include both interconnects (e.g., connectors and leadframes) and substrates (e.g., printed circuit boards and semiconductor chips).

We claim:

1. A method for producing a coated heat exchanger tube, comprising the steps of:

placing at least one gas jet nozzle inside the heat exchanger tube;

creating an air-tight seal on both ends of the heat exchanger tube;

evacuating the inside of the heat exchanger tube to a pressure no less than 5 millitorr;

directing a carrier gas containing a vaporized coating material to the gas jet nozzle after evacuating; and impinging the carrier gas containing the vaporized coating material on the inside of the heat exchanger tube via the at least one gas jet nozzle creating a coating layer.

2. The method of claim 1, wherein the step of impinging includes the substep of translating the at least one gas jet nozzle relative to the heat exchanger tube.

3. The method of claim 1, wherein the step of impinging includes the substep of translating the heat exchanger tube relative to the at least one jet gas nozzle.

4. The method of claim 1, including the step of selecting the vaporized coating material from the group consisting of vaporized copper, lead, steel, titanium, alloys thereof, and plastic.

5. The method of claim 1, wherein the thickness of the coating layer is less than 10 microns.

6. The method of claim 1, wherein the thickness of the coating layer includes the range from about 1 micron to about 5 microns.

7. The method of claim 1, wherein the heat exchanger tube includes raised surfaces inside the tube.

8. A method for producing coating on an article having an inside, an outside, and openings between the inside and outside, comprising the steps of:

placing at least one gas jet nozzle inside the article;

creating an air-tight seal on each of the openings of the article;

evacuating the inside of the article to a pressure no less than 5 millitorr;

directing a carrier gas containing a vaporized coating material to the gas jet nozzle; and impinging the carrier gas containing the vaporized coating material on the inside of the heat exchanger tube via the at least one gas jet nozzle creating a coating layer.

9. The method of claim 8, where in the step of impinging includes the substep of translating the at least one gas jet nozzle relative to the article.

10. The method of claim 8, wherein the step of impinging includes the substep of translating the heat exchanger tube relative to the at least one gas jet nozzle.

11. The method of claims 1 or 8, including the step of selecting the vaporized coating material from the group consisting of oxides, nitrides, and metals.

12. A method for preparing leadframes for substrate bonding, comprising the steps of:

providing a deposition chamber;

providing at least one gas jet nozzle in the deposition chamber;

directing a carrier gas having at least one vaporized coating material to the at least one gas jet nozzle;

providing leadframes in a continuous stream from a roll of leadframes;

translating the continuous stream to position at least one leadframe to be impinged by the carrier gas having at least one vaporized coating material from the at least one gas jet nozzle;

evacuating the deposition chamber to a pressure no less than 5 millitorr; and impinging the carrier gas having at least one vaporized coating material on portions of the at least one leadframe to deposit a coating layer after evacuating.

13. The method of claim 12, including the steps of:

selecting the at least one vaporized coating material from the group consisting of silver, aluminum, tin, palladium, nickel, and alloys thereof; and selecting the at least one leadframe from the group consisting of copper alloy leadframes and iron-nickel alloy leadframes.

14. The method of claim 12, wherein the coating layer is substantially non-porous and has a thickness no greater than 3 microns.

15. The method of claim 12, including the step of providing additional gas jet nozzles for depositing additional coating layers on portions of the at least one leadframe.

16. The method of claim 15, including the step of selecting the additional coating layers from the group consisting of silver, aluminum, tin, palladium, zinc, nickel, chromium, iron, alloys thereof, oxides, nitrides, carbides, combinations thereof, and adhesives.

17. A method for preparing leadframes for substrate bonding, comprising the steps of:

providing a deposition chamber;

providing at least one gas jet in the deposition chamber;

directing a gas having at least one coating material to the at least one gas jet;

positioning at least one leadframe to be impinged by the gas from the at least one gas jet;

evacuating the deposition chamber to a pressure no less than 5 millitorr;

impinging the gas on portions of the at least one leadframe to deposit a coating layer; and providing at least one stencil between the at least one gas jet and the at least one leadframe for patterning the coating on the at least one leadframe.

18. The method of claim 17, further comprising the steps of:

depositing additional coating layers using additional gas jet nozzles; and providing additional stencils for patterning the additional coating layers.

* * * * *